US005153890A

United States Patent [19]
Bona et al.

[11] Patent Number: 5,153,890
[45] Date of Patent: Oct. 6, 1992

[54] SEMICONDUCTOR DEVICE COMPRISING A LAYERED STRUCTURE GROWN ON A STRUCTURED SUBSTRATE

[75] Inventors: Gian-Luca Bona, Affoltern am Albis; Wilhelm Heuberger, Richterswil, both of Switzerland; Peter Roentgen; Peter Unger, both of Thalwil, Fed. Rep. of Germany

[73] Assignee: International Business Machines Corporation, Armonk, N.Y.

[21] Appl. No.: 782,834

[22] Filed: Oct. 24, 1991

[51] Int. Cl.⁵ .............................................. H01S 3/19
[52] U.S. Cl. ...................... 372/48; 372/46; 372/45; 357/17
[58] Field of Search ............. 372/48, 46, 45; 357/17, 357/16

[56] References Cited

U.S. PATENT DOCUMENTS

| | | | |
|---|---|---|---|
| 4,791,649 | 12/1988 | Yamamoto et al. | 372/46 |
| 5,010,556 | 4/1991 | Imanaka et al. | 372/46 |
| 5,115,443 | 5/1992 | Miyazawa | 372/46 |

FOREIGN PATENT DOCUMENTS

| | | | |
|---|---|---|---|
| 0089287 | 6/1982 | Japan | 372/48 |
| 0162382 | 10/1982 | Japan | 372/48 |
| 60-5582 | 1/1985 | Japan | 372/48 |
| 0220391 | 9/1986 | Japan | 372/48 |
| 0038082 | 2/1991 | Japan | 372/48 |

OTHER PUBLICATIONS

"Dependence of Photoluminescense Peak Energy of MOVPE-grown AlGInP on Substrate", by S. Minagawa, et al., in Electronics Letters, vol. 25, No. 12, Jun. 8, 1989, pp. 785-759.
"Novel Window-Structure AlGaInP Visible-Light Laser Diodes with Non-Absorbing Facets Fabricated by Utilizing GaInP Natural Superlattice Disordering", by Y. Uena, et al., in Japanese Journal of Applied Physics, vol. 28, No. 9, part 2, Sep. 1990, pp. L1666-L1668.
"Compositional Modulation in $Al_{1-x}Ga_1As$ Epilayers Grown by Molecular Beam Epitaxy on the (111) Facets of Grooves in a Non-Planar Substrate", by M. E. Hoenk, et al., in Applied Physics Letters, vol. 55, No. 1, Jul. 3, 1989, pp. 53-55.
"Evidence for the Existence of an Ordered State in $Ga_{0.5}In_{0.5}P$ Grown by Metalorganic Vapor Phawe Expitaxy and its Relation to Band-gap Energy", by A. G. T. Suzuki, et al., in Allied Physics Letters, vol. 50, No. 11, Mar. 16, 1987, pp. 673-675.

Primary Examiner—Georgia Y. Epps
Attorney, Agent, or Firm—Henri Daniel Schnurmann; Donald M. Boles

[57] ABSTRACT

A semiconductor device such as a laser diode grown on a structured substrate surface having horizontal regions and adjacent inclined sidewall surfaces. The horizontal regions are of standard orientation while the inclined surfaces are misoriented. The layers forming the device are grown on top of a structured surface, with at least the active layer of the semiconductor material assuming an ordered state which depends on the orientation of the substrate surface. The center section of the active layer is deposited on top of a horizontal region. This section is in the ordered state and has a lower bandgap energy than the terminating sections which are grown on the inclined regions and which exhibit a wider bandgap. The active layer can be terminated in either lateral direction with wider bandgap materials so that buried devices can be obtained that provide strongly confined and non-absorbing mirrors.

9 Claims, 3 Drawing Sheets $Eg_{dis} - Eg_{ord} \approx 100\,meV$

SEMICONDUCTOR DEVICE COMPRISING A LAYERED STRUCTURE GROWN ON A STRUCTURED SUBSTRATE

FIELD OF THE INVENTION

The invention relates to semiconductor devices (such as laser diodes) comprising layered structures grown on a structured substrate having horizontal surface regions and adjacent inclined sidewall facets. The invention is particularly well suited for visible wavelength laser diodes with an active layer made of semiconductor materials. The active layer can be "terminated" with wider bandgap material in any lateral direction so that buried devices can be obtained that provide strongly confined and non-absorbing mirrors.

BACKGROUND OF THE INVENTION

The present invention has found wide application in semiconductor laser diodes presently used in a variety of information handling systems. Their compact size and manufacturing process have some unique advantages, particularly in making them compatible with associated electronic circuitry within the same substrate. Laser diodes of this type have successfully been used in data communication, optical storage and laser beam printing, and have been optimized in applications which advantageously use their wavelength, optical power, high speed modulation characteristics and beam quality.

The invention herein described is of interest to short wavelength lasers, and more particularly to laser printers and optical disk systems requiring narrow beams at high optical power. Very attractive for such applications are (Al)GaInP laser diodes operating in the 0.6 µm wavelength range. These short wavelength materials, however, have characteristics that are noticeably different from (Al)GaAs systems and which potentially can introduce additional problems. Consequently, concepts and designs adequate for (Al)GaAs devices are not generally suited for visible light lasers.

The present invention provides a solution to two key requirements: a strong current and carrier confinement to obtain low threshold, highly efficient laser diodes. Additionally, it provides protection against catastrophic optical mirror damage occurring as a result of heat developing at the mirror facets, which limits the high output power operation in long lifetime devices.

Substantial improvements in carrier and current confinement have been achieved with the so-called "buried structures" wherein the active layer of the laser is embedded in a wider bandgap material in a direction parallel to the waveguide that shapes the laser cavity. However, known structures require complex fabrication processes. Most commonly used is a process that starts with an etch step to obtain a mesa including the GaInP active layer. The mesa is then buried using a sequence of epitaxial regrowth steps. This technology is not only accompanied by a strong loss in device yield, but it can also cause severe device reliability problems.

An example of a buried structure and its fabrication process is disclosed in the European Patent Application 0 348 540 "Process for the selective Growth of GaAs". Here, a patterned substrate with horizontal and inclined surface sections of different crystal orientation is used to provide a selective growth of an active layer on horizontal surfaces whereas the embedding wider bandgap cladding layers grow on both, the horizontal and the inclined surfaces. Like other methods that rely on a crystal orientation that depends on no or reduced-growth effects, this process is problematic in that, during the epitaxy process, no or reduced-growth unprotected facets may be contaminated, thereby affecting the crystal structure.

Efforts have also been invested in the design of laser structures having non-absorbing mirrors (NAM) to avoid excessive heating by non-radiative carrier recombination near the mirror facets. Here, the general approach is to terminate the active layer with a so-called "window structure" consisting of a transparent, wider bandgap material, thereby substantially reducing the number of carrier pairs near the facet. NAM laser structures of this nature have been disclosed in several publications and patent applications.

Article, "Non-Absorbing Laser Mirrors", published in the IBM Technical Disclosure Bulletin, Vol. 31, No. 2, July, 1988, p. 240, describes an (Al)GaAs laser consisting of a layered structure comprising an active GaAs quantum well layer embedded between cladding layers. The layers are grown on the structured surface of a GaAs substrate with the center portion on a (100)-plane, and both mirror regions on (411)-planes. Since the GaAs growth speed is markedly slower on (411)-surfaces, the width of the active quantum well layer is reduced near the mirror regions. This results in an increased effective bandgap.

European Patent Application 0 332 723 "High-Power Semiconductor Diode Laser", shows a laser structure formed on a patterned substrate having planar mesa and groove-sections with inclined transition zones in between. The layered structure comprises an active and a passive waveguide. The gain segment of the active waveguide is aligned with the non-absorbing section of the passive waveguide. Light generated in the gain section is coupled to the non-absorbing section through an inclined cladding layer where it is fully guided as it propagates towards the mirror facets.

Article, "Vertically Emitting Laser with integrated NAM deflector", published in the IBM Technical Disclosure Bulletin, Vol. 32, No. 3B, August, 1989, pp. 498–499, describes other forms of non-absorbing mirror or deflector structures. In one particular instance, the active layer, made of quantum wells, is disordered by ion implantation or diffusion, thereby rising the bandgap of the active layer.

Article, "Novel Window-Structure AlGaInP visible LDs with non-absorbing Facets formed by disordering of natural Superlattice in GaInP Active Layer", by Y. Ueno et al, published by the 12th IEEE International Semiconductor Laser Conference, Davos/Switzerland, September, 1990, pp. 30–31, which describes a visible light AlGaInP laser diode with a higher bandgap ($E_g$) crystal incorporated at the mirror facets. This is accomplished by selective disordering of the GaInP active layer with diffused impurity (Zn) near the facets where ($E_g$) increases. A marked increase in maximum light output power is detected.

Article, "Window Structure InGaAlP Visible Light Laser Diodes by Self-Selective Diffusion-Induced Disordering" by K. Itaya et al, published in the same Conference Digest as the previous reference, pp. 36–37, Zn-diffusion-induced disordering is used to create a wider bandgap window region for an InGaAlP laser structure. The diffusion is obtained below an n-cap layer selectively left in the mirror region.

These known non-absorbing mirror concepts require rather complex structures and fabrication processes and run counter to the demand for higher yield and "easy-to-make" non-absorbing mirror laser diodes.

The present invention discloses a new design of laser devices in which a strong current and carrier confinement that includes non-absorbing mirror waveguides can be realized in a single epitaxial step. This is achieved through local bandgap variation by simultaneous in-situ growth of ordered and disordered phase semiconductor materials of the Group III on a structured substrate.

The present invention is based on the phenomenon that certain semiconductor materials, especially (Al)-GaInP, which have become very important for visible light laser, have been found to exist in several phases, i.e., ordered and disordered, which differ in the atomic arrangement of group III species. They have also been known to display a bandgap energy $E_g$ that increases when changing from the ordered to the disordered phase, and to grow under standard growth conditions in the ordered phase on a standard substrate orientation (or on a slightly misoriented surface). The disordered phase is, on the other hand, obtained in case of stronger misoriented substrates.

These material characteristics have been investigated and reported on in the following publications:

"Evidence for the Existence of an ordered State in GaInP grown by Metal Organic Vapor Phase Epitaxy and its Relation to Band-Gap Energy", by A. Gomyo et al, published in Appl. Phys. Lett. 50(11), Mar. 16, 1987, pp. 673-675. It demonstrates that epitaxial layers can assume states of different bandgap energy ($E_g$) corresponding to an ordered and random (Ga,In) distribution on column III sublattices depending on III/V ratios and growth temperatures.

"Dependence of Photoluminescence Peak Energy of Metal Organic Vapor Phase Epitaxy (MOVPE)-grown AlGaInP on Substrate Orientation", by S. Minagawa et al, published in Electronic Letters, Jun. 8, 1989, Vol. 25, No. 12, pp. 758-759, which describes measurements of GaInP and AlGaInP materials grown by Metal Organic Vapor Phase Epitaxy. It has been found that the bandgap increases as the substrate misorientation with respect to the (100)-plane increases and saturates at high inclination angles due to a complete transformation into a random alloy.

These papers describe the material properties upon which the present invention is based but not suggestion is made on the use of structured substrates to selectively achieve regions of distinct bandgaps, nor do they propose the application of the investigated phenomena to achieve buried heterostructures and/or non-absorbing mirror facets in diode laser technology.

OBJECTS OF THE INVENTION

Accordingly, an object of the present invention is to provide a semiconductor device with improved current and carrier confinement characteristics using conventional, easy-to-control processes.

Another object is to provide a semiconductor device, such as a laser diode having an active waveguide, with essentially non-absorbing mirror sections and using a one-step epitaxy process.

A further object is to provide a semiconductor device comprising an active waveguide having sections of wide bandgap material in both lateral directions to improve carrier confinement and obtain non-absorbing mirrors.

Still another object is to provide a semiconductor device, such as a laser diode, and a method of fabrication, wherein the device has an active layer comprising sections of different bandgap energies, and wherein the active layer can be fabricated in-situ in a single process step.

The present invention is intended to meet these objectives and remedy the deficiencies of known semiconductor devices, particularly of laser diodes. This is accomplished by a layered structure forming the device to be grown on a structured substrate. At least the active layer is of a semiconductor material that assumes ordered or disordered states as a function of the substrate surface orientation or misorientation, these states having different bandgap energies $E_g$. Bent terminating sections of the active layer, grown on misoriented substrate surface portions, provide a bandgap energy higher than that of the center section and the fabrication of buried lasers and/or of active layers terminated with a wide bandgap section which, in laser diode applications, provides for non-absorbing mirrors. The active layer, comprising high and low bandgap regions, can be fabricated in-situ, i.e., in a single epitaxy process step.

The advantages offered by the invention can be summarized as follows:

The buried heterostructure device provides improved confinement in laser applications and protection of the device against catastrophic optical mirror damage when it is fabricated with non-critical conventional epitaxy processes;

An improved laser performance with respect to threshold current values, efficiency, reliability and optical output power is likewise obtained;

Planar technology processes can be used because the relied-upon effect requires only small inclination angles at the substrate surface, and the in-situ epitaxial deposition process reduces critical alignment requirements to a minimum; and The use of shallow, inclined facets avoids material redistribution and differences in reaction rates that, otherwise, could cause local changes in the composition resulting in strains or in the formation of defects.

BRIEF DESCRIPTION OF THE DRAWINGS

The foregoing and other objects, features and advantages of the present invention will be apparent from the following and more particular description of the preferred embodiments as illustrated in the accompanying drawings, in which.

DETAILED DESCRIPTION OF THE PREFERRED EMBODIMENTS

Figure 1:
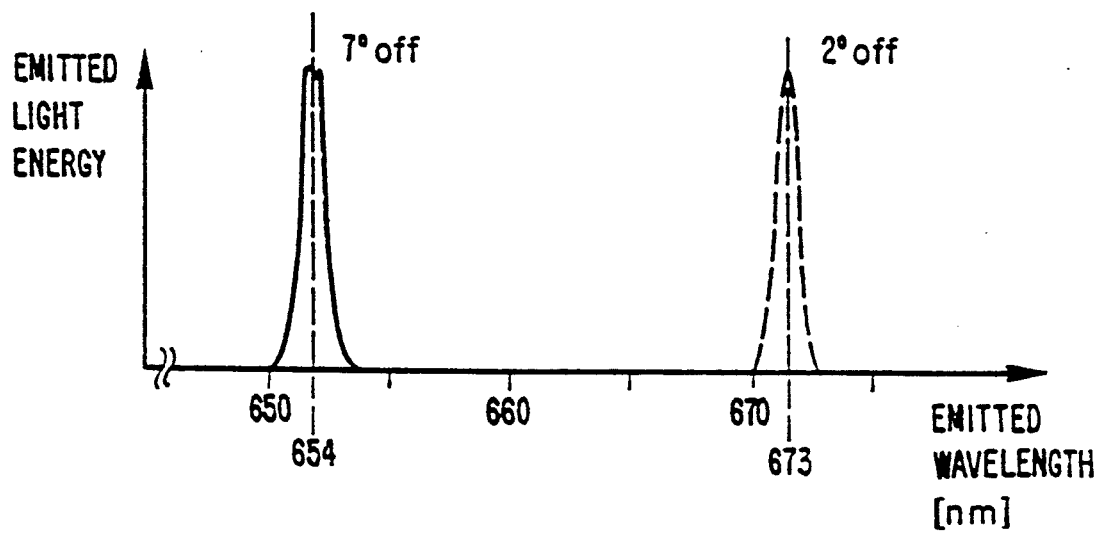
FIG. 1 shows how the bandgap energy and the emission wavelength are affected for two laser diodes deposited during the same growth run on substrates of different surface misorientation.
Figure 2A:
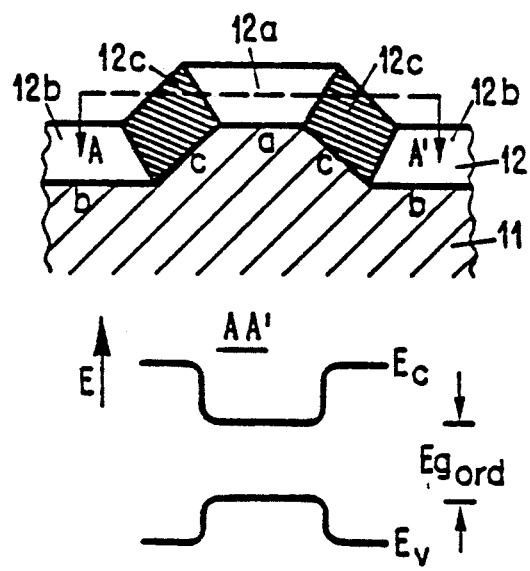
FIG. 2A/2B are schematic views of layered ridge (A) and groove (B) structures that are used to illustrate the phenomenon upon which the invention is based.

Prior to describing the preferred embodiments of the inventive semiconductor device in detail, the basic principles upon which the invention is based will be outlined with the aid of FIGS. 1 and 2A/2B.

Certain III/V semiconductor materials, especially (Al)GaInP, can exist in different phases which differ in the atomic arrangement of group III species. Depending on the conditions during growth, (e.g., in a Metal Organic Vapor Phase Epitaxy (MOVPE) process), a random or disordered alloy phase, or an ordered phase, where Ga and In atoms are regularly arranged, (e.g., in the <111> direction), is obtained. The noteworthy difference between the phases occurs when the bandgap energy $E_g$ of the same material is, in the disordered phase, 70 to 150 meV higher than in that in the ordered phase. Whether the semiconductor material will grow in the ordered phase or in the disordered phase, can be determined by the orientation of the substrate upon which it grows. Under typical MOVPE growth conditions, yielding high optical quality materials, GaInP grows in the ordered phase on standard substrate orientations such as (100) or slightly off-orientations (e.g., 2~), whereas it will grow in the disordered, random alloy phase on a stronger misoriented substrate at a low off-angle of e.g., 7~.

FIG. 1 shows emission spectra of two lasers (of the GaInP MQW GRINSCH type) grown simultaneously side by side on (100) 2~ off=>(110) and 7~ off-=><111> A GaAs substrates, respectively. The emission wavelengths of the two lasers have been measured as 673 nm and 654 nm for the 2~ off and the 7~ off substrate orientations, respectively, with the difference in wavelength caused by the difference in bandgap energy. The composition of the alloys deposited on the two substrates has been measured and determined to vary by less than 1% thereby verifying that stoichiometric incorporation can be achieved in spite of small differences in inclination.

It has also been found that local bandgap variations can also be obtained within a layer (or layered structure) that is grown on a single structured substrate having surface regions of different misorientation. This is illustrated in FIG. 2A showing a schematic diagram of a simple structure comprising a structured substrate onto which an (Al)GaInP-layer is grown. The substrate 11, may consist of (100)-oriented GaAs. As shown, it is structured to form a shallow ridge providing horizontal mesa (a) and groove (b) regions that are (100) slightly misoriented, as well as inclined transition regions (c) of stronger misorientation. Grown on this structured surface is a layer 12 of (Al)GaInP, i.e., a III/V semiconductor material that can exist in an ordered or disordered phase. On the oriented (or slightly misoriented) horizontal surface regions (a,b), the (Al)GaInP layer is in an ordered phase with a bandgap corresponding to an emission wavelength of about 670 nm. In the inclined regions (c) of stronger misorientation, the material is disordered, with the bandgap corresponding to an emission wavelength of about 650 nm. This is illustrated in the figure: sections 12a and 12b of (Al)GaInP layer 12, grown on oriented substrate surfaces a and b, and consisting of ordered material, whereas sections 12c (shaded areas), grown on misoriented substrate surfaces c, are of the disordered phase type.

Changes in bandgap energy $E_g$ occurring at the ordered-disordered material interfaces are schematically illustrated in the energy (E) diagrams of the conduction band ($E_c$) and the valence band ($E_v$) shown below the structure. The difference between the energy gaps $Eg_{dis}$ for the disordered material and $Eg_{ord}$ for the ordered material has been found to be in the range of 70 to 150 meV.

Figure 2B:
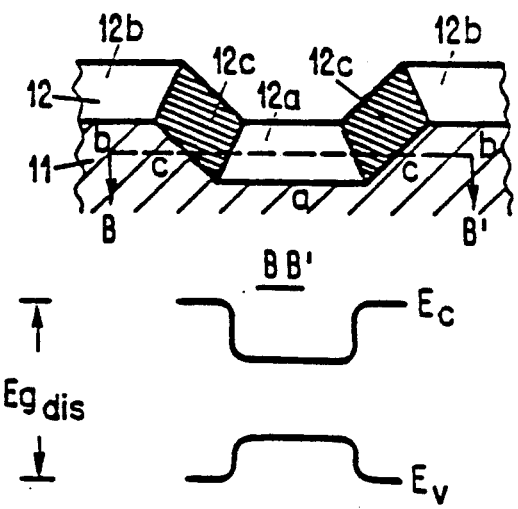

FIG. 2B is an illustration of a groove-structure showing the same effect: layer 12, grown on the structured surface of substrate 11, comprising ordered and disordered regions as in the ridge structure of FIG. 2A, resulting in the same energy diagram.

Figure 3:
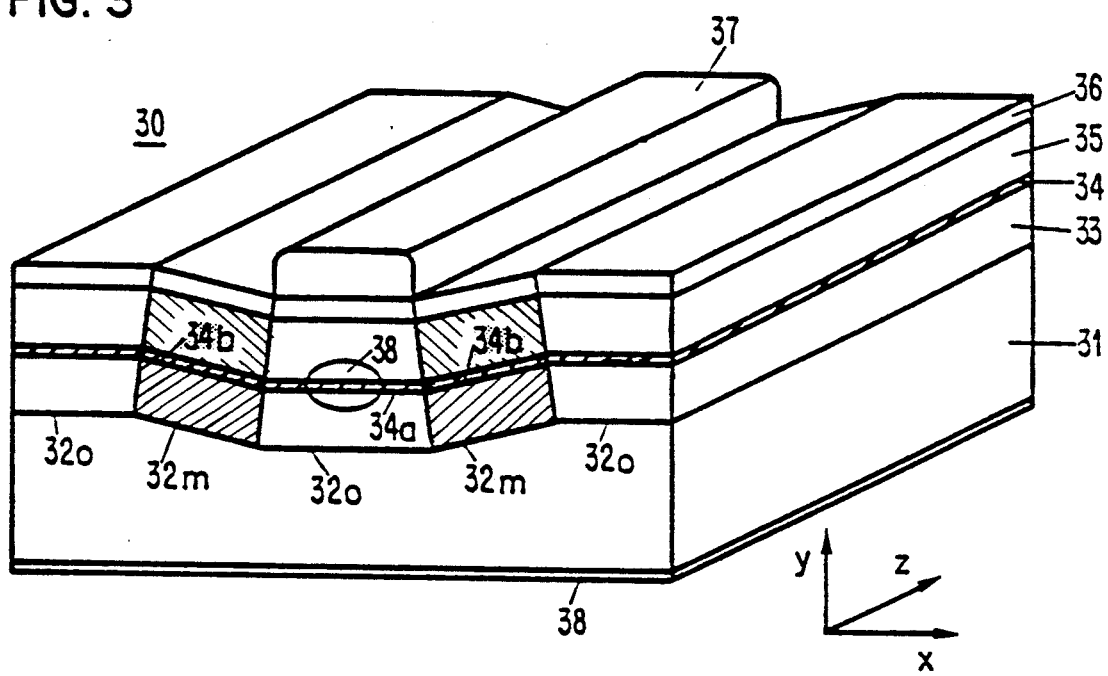
FIG. 3 is a perspective view of a first embodiment of the invention. Shown is a groove-type laser diode having a buried active layer for achieving effective confinement.

FIG. 3 is a perspective view of a first embodiment of a semiconductor device designed and manufactured in accordance with the present invention, the embodiment being a laser diode structure 30 providing an improved lateral current and carrier confinement.

Basically, laser 30 is a groove-type structure grown on an n-doped GaAs substrate 31 having a structured surface. The substrate surface comprises horizontal regions 32o with inclined transition regions or sidewall facets 32m in between. The shallow groove formed at the substrate surface is in the direction of the light emitting waveguide of the laser structure (FIG. 3, parallel to the z-coordinate). Grown on the structured surface is a stack of semiconductor layers. In the embodiment, this consists of an n-doped AlGaInP lower cladding layer 33; the active, undoped GaInP layer 34 for carrier recombination and light guiding; a p-doped AlGaInP upper cladding layer 35; and a highly doped, low resistance p-GaAs contact layer 36. Ohmic contacts 37 and 38 are arranged on top of contact layer 36 and at the bottom of substrate 31, respectively. At both ends of the layered structure, mirror facets (in x-y planes) are formed, their distance determining the length of the laser cavity.

When applying a voltage of sufficient level and of proper polarity to the ohmic contacts that feeds a current through the device in excess of the threshold current, a laser beam parallel to the plane of the active layer 34 is emitted from light mode region 38.

In accordance with the invention, the horizontal surface regions 32o are "oriented" in a direction determined by the substrate used, (in the example, a standard (100)-oriented GaAs substrate). In contrast thereto, the inclined regions 32m are misoriented, the inclination angle being 7~. Due to the above explained phenomena that causes certain materials to grow in the disordered phase on misoriented surfaces, the (Al)GaInP sections over the inclined sidewall facets 32m (shown in the figure as shaded areas) are made of a material having a higher bandgap than that of the sections grown over the oriented substrate surface regions 32o. As a result, section 34a of the active layer, in which the recombination processes and the laser beam are generated, is laterally buried by terminating sections 34b of higher bandgap that provide excellent current and carrier confinement. The bend in the layer provides, in addition, good lateral optical confinement. If desired, stronger confinement can be achieved by stronger bending of the active layer.

Referring now to FIG. 3, the fabrication process for the laser structure 30 will be outlined. The starting point is a standard (100)-oriented n-doped GaAs substrate having a Si doping concentration of $2 \times 10^{18} cm^{-3}$. Next, the shallow grooves are prepared on the substrate surface using standard lithography and etching techniques. First, photoresist stripes parallel to the z-axis are formed to define the groove, with the groove formed using a wet chemical etch process, such as a mixture of $H_2SO_4$, $H_2O_2$, and water. Underetching causes the formation of the desired inclined sidewall facets. In the embodiment, the groove of the structured surface is about 0.5 μm deep and at the bottom (horizontal region 32o) 6 μm wide; regions 32m are about 4 μm long, and the inclination about 7~. After removal of the photo resist stripes, the substrate is loaded into an MOVPE system where the following layers are epitaxially grown in a single in-situ process:

n-doped lower cladding layer 33 of $(Al_xGa_{(1-x)})_{0.5}In_{0.5}P$ with an Al-concentration of:
  x=0.8, 1 μm thick and with an Si-doping of $1 \times 10^{18} cm^{-3}$;

undoped active layer 34 of $Ga_{0.5}In_{0.5}P$, approximately 100 nm thick;

p-doped upper cladding layer 35 of $(Al_xGa_{(1-x)})_{0.5}In_{0.5}P$ with an Al-concentration of: x =0.8, 1 μm thick and with an Zn-doping of $1 \times 10^{18} cm^{-3}$; and p-doped contact layer 36 of GaAs, 200 nm thick and with a Zn-doping of $1 \times 10^{19} cm^{-3}$.

In the next step, ohmic contact stripes 37 are applied on top of the GaAs contact layer 36. The stripe geometry of the contact is formed by a lithographically patterned photoresist mask for the evaporation of the contact metal which may, in turn, consist of a titanium/platinum/gold sandwich. This step is then followed by a lift-off process. Ohmic contact 38 at the bottom side of the n-doped substrate 31 is obtained by alloying germanium, gold and nickel. Finally, the substrate is cleaved to form the mirror facets and to separate the devices.

Figure 4:
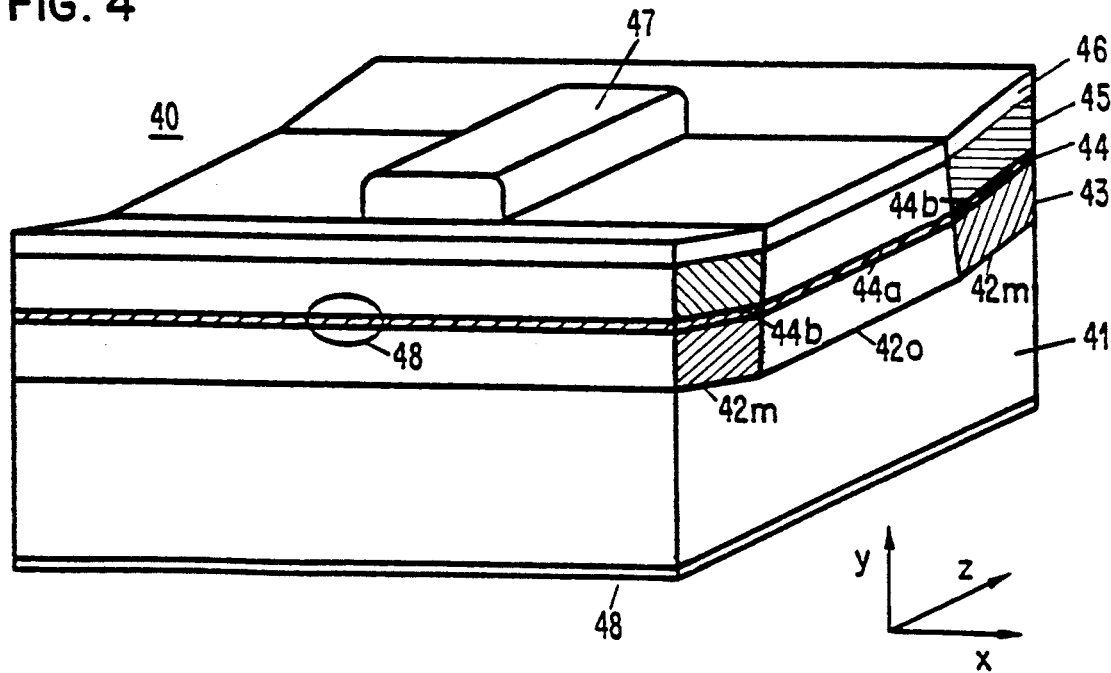
FIG. 4 is a perspective view of a second embodiment of the invention. Shown is a groove-type laser diode having non-absorbing mirror sections to avoid catasroptical optical damage.

Referring now to FIG. 4, a perspective view of a second embodiment of the invention may be seen. Shown is a laser diode 40 with non-absorbing mirror (NAM) sections allowing a high-power operation. A very simple gain-guided laser structure is chosen for explanation purposes. Laser 40 is a structure similar to that shown in FIG. 3, the main difference being that the groove is formed in the x-direction, i.e., it is perpendicular to the emitting waveguide of the device.

Laser 40 is grown on an n-doped GaAs substrate 41 having a structured surface with horizontal region 42o and, at both ends thereof, inclined terminating regions 42m. The shallow groove so formed is perpendicular to the waveguide of the laser structure. Grown on the substrate is a stack of semiconductor layers, comprising an n-doped AlGaInP lower cladding layer 43, undoped GaInP active layer 44, upper p-doped AlGaInP cladding layer 45, and a p-doped contact layer 46. Ohmic contacts 47 and 48 are applied as shown on the top of the contact layer 46 and to the bottom of the substrate 41. Mirror facets, in x-y planes, are formed at both ends of the layered structure.

In accordance with the invention, the horizontal surface region 42o is "oriented", (e.g., (100)), whereas the inclined regions 42m are misoriented, (e.g., 7~ off). As a result, sections of the semiconductor layers grown onto the oriented substrate region 42o are in the ordered phase, whereas the sections above the inclined surfaces 42m remain in a disordered phase. Since the (Al)GaInP semiconductor material grows in the disordered, higher bandgap phase on misoriented surfaces, the semiconductor sections over the inclined sidewall facets 42m (in FIG. 4, shown as shaded) consist of material of higher bandgap energy than the sections grown over oriented substrate surface 42o. As a result, gain section 44a of the active layer in which the laser beam is generated is terminated at both mirror ends with higher bandgap sections 44b providing a window or NAM portion through which the laser light is emitted. Due to the high bandgap termination of the active layer, the number of carrier pairs in the mirror section is greatly reduced. This also avoids non-radiative carrier recombination and helps reduce heat generation. The light beam "follows" the bent active layer leaving the device through the light mode region 48.

The process of fabricating the laser shown in FIG. 3 can be used substantially unchanged and with the same materials, dimensions, doping concentration, etc., as the process of fabrication of the device shown in FIG. 4. It is evident, though, that the groove dimensions and its orientation with respect to the active waveguide need to be adjusted. The inclination angle and the length of the inclined, misoriented surface regions may be kept the same but the width of the groove has to be increased (to, e.g., 250 to 300 μm) and adjusted to obtain the desired cavity length of the laser.

Figure 5:
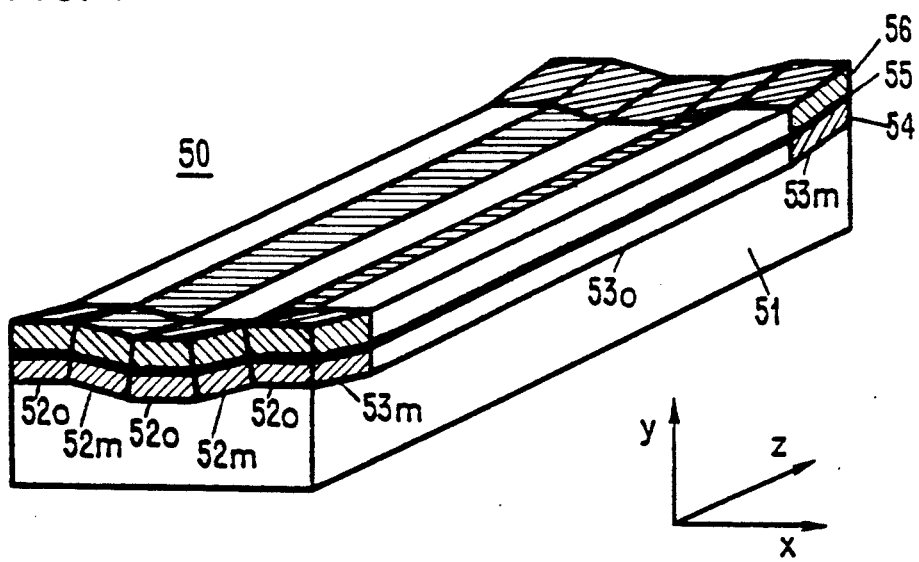
FIG. 5 is perspective view of a third embodiment of the invention. Shown is a groove-type laser diode having both, a buried active layer and non-absorbing mirror sections, thereby providing effective confinement and a high power output by avoiding catastrophic optical damage caused by heat developing at the mirrors.

FIG. 5 shows a simplified view of a third embodiment of the invention. It illustrates a laser diode 50 having higher bandgap sections terminating the active layer in both lateral directions whereby devices with good confinement AND non-absorbing mirrors can be obtained, thereby providing high output power.

Laser 50 consists, like the devices illustrated in FIGS. 3 and 4, of a stack of layers grown on the structured surface of a substrate 51. The stack includes a lower cladding layer 54, an active layer 55, and an upper cladding layer 56. For simplicity reasons, the contact layer deposited on top of cladding layer 56 and the ohmic contacts attached to the contact layer and to the substrate are not shown.

The structure differs from those of FIGS. 3 and 4 in that the substrate surface and thus the epitaxially grown semiconductor layers form grooves not only in one direction (z or x) as in the previously described embodiments but in two directions: parallel to the active waveguide in the z-direction and perpendicular thereto in the x-direction. This is accomplished by more complex structuring of the substrate surface. In the z-direction, the surface has horizontal, oriented surface regions 52o with inclined misoriented regions 52m in between whereas, in the x-direction, the surface has horizontal regions 53o oriented with the horizontal regions 52o, and inclined and misoriented regions 53m. In FIG. 5, those sections of the different semiconductor layers that are grown on inclined substrate surfaces and thus of higher bandgap energy are emphasized, appear as shaded areas.

The completed device 50 of FIG. 5, when fabricated in accordance with the process described in connection with the first two embodiments, combines the features and effects of earlier described devices in that it provides strong carrier confinement and a NAM structure.

With reference to the embodiments herein described, it has been shown that by choosing a suitable arrangement of the grooves and the mirror facets, lasers with lateral current confinement as well as lasers with non-absorbing mirrors and even a combination of both, can be achieved. The disclosed embodiments are groove-type devices, but similar results can be obtained using other devices, such as ridge-type devices, when their design is based on the same concept and using the processes herein described essentially unmodified.

The invention is not only applicable to laser diodes, but it may also lead to improvements in other semiconductor devices where the structure provides a bandgap-controlled carrier confinement. The invention could be of particular interest to bipolar devices.

Although the invention has been described and illustrated with certain preferred embodiments, it is understood that the present disclosure has been made by way of example only and that the invention is by no means limited to devices and processes using the particular materials, dimensions, doping concentration or process parameters used for the above described embodiments. Changes may be made by those skilled in the art without departing from the spirit and scope of the invention as hereinafter described. Materials other than (Al)-GaInP or III/V or II/VI compounds, ternary, quaternary, etc., could also be candidates provided these materials can exist in two distinct phases, which differ in this atomic arrangement and band energy.

In the described embodiments, the substrates used were of a standard orientation such as (100), allowing normal epitaxial growth. Substrates of different orientation may also be used provided they allow proper growth with the employed epitaxy process.

Instead of using an "exactly oriented" substrate such as (100), a slightly "off" oriented substrate surface may also be used. This can be advantageous in that it provides for a defined nucleus serving as a basis for crystal growth. High quality devices can be grown on slightly misoriented, e.g., 2~ off, surfaces. Different misorientation directions are feasible, directions (110) and (111) being examples.

The required misoriented substrate surfaces on which disordered material is to grow, may be obtained with inclination angles other than the above described 7~. In fact, structures with angles of about 25~ which are easier to make, have been successfully tested. For even larger angles, limitations are to be expected. They may lead to changes in material composition as described above, or may deteriorate the waveguide function. In addition, the advantageous planar technology may no longer be applicable.

MOVPE was chosen as the preferred process for fabricating the inventive device, but other epitaxy processes will be just as suitable besides providing the atomic ordering effect on which the invention is based.

In fabricating the inventive structure, a cleavage process for forming the mirror facets and for separating the devices grown on the substrate can be used as indicated above. Other methods such as etch processes, particularly Reactive Ion Etch (RIE) techniques, may equally well be used to form the mirror facets.

What is claimed is:

1. A semiconductor layered structure device with horizontal sections separated by adjoining inclined sidewall facets, comprising:

a semiconductor structured substrate;
   a layer on top of said semiconductor structured substrate, with portions of said layer assuming an ordered state and the remaining portions of said layer a disordered state, wherein said ordered and disordered states exhibit different bandgap energy that depend on the orientation of said semiconductor structured substrate, said layer comprising a center section deposited on top of a corresponding horizontal region of said semiconductor structured substrate and adjacent inclined sidewall terminal facets extending from the end of said horizontal section in at least one lateral direction and lying on top of corresponding inclined sections of said semiconductor structured substrate, such that the orientation of said inclined sidewall terminal facets have a bandgap different from that of said center section.

2. A semiconductor layered structure device as in claim 1, wherein said semiconductor layered structure device is a laser diode and said semiconductor structured layer is in the active layer of a laser diode.

3. A semiconductor layered structure device as in claim 2, wherein said active layer comprising said center section and said terminating sections is sandwiched between cladding layers to form an active waveguide, said terminating sections being parallel to the longitudinal axis of the waveguide, thereby providing lateral confinement.

4. A semiconductor layered structure device as in claim 2, wherein said active layer comprising said center section and said terminating sections is sandwiched between said cladding layers to form an active waveguide, said terminating sections being perpendicular to the horizontal axis of said waveguide, thereby providing a non-absorbing mirror structure.

5. A semiconductor layered structure device as in claim 2, wherein said active layer comprising said center section and said terminating sections is sandwiched between said cladding layers to form an active waveguide, said terminating sections being arranged parallel as well as perpendicular to the horizontal axis of said waveguide, thereby providing lateral confinement and non-absorbing mirror termination.

6. A semiconductor layered structure device as in claim 1, wherein the device consists of (Al)GaInP semiconductor material.

7. A semiconductor layered structure device as in claim 1, wherein the device is a bipolar device of a structure providing for bandgap-controlled carrier confinement.

8. A semiconductor layered structure device as in claim 1, wherein the substrate is of a standard crystal orientation such as (100), either exact or about 2~ misoriented.

9. A semiconductor layered structure device as in claim 1, wherein the inclination angle of said sidewall facets range from 6~ to 30~.

* * * * *